US009852786B2

(12) United States Patent
Takizawa et al.

(10) Patent No.: US 9,852,786 B2
(45) Date of Patent: Dec. 26, 2017

(54) SEMICONDUCTOR MEMORY DEVICE THAT VARIES VOLTAGE LEVELS DEPENDING ON WHICH OF DIFFERENT MEMORY REGIONS THEREOF IS ACCESSED

(71) Applicant: TOSHIBA MEMORY CORPORATION, Tokyo (JP)

(72) Inventors: Kazutaka Takizawa, Yokohama Kanagawa (JP); Masaaki Niijima, Tokyo (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/066,944

(22) Filed: Mar. 10, 2016

(65) Prior Publication Data
US 2017/0117032 A1    Apr. 27, 2017

Related U.S. Application Data

(60) Provisional application No. 62/244,355, filed on Oct. 21, 2015.

(51) Int. Cl.
  G11C 16/04    (2006.01)
  G11C 11/4091  (2006.01)
  G11C 11/406   (2006.01)

(52) U.S. Cl.
  CPC .... G11C 11/4091 (2013.01); G11C 11/40607 (2013.01)

(58) Field of Classification Search
  CPC ......... G11C 11/4091; G11C 11/40607; G11C 11/16; G11C 16/26; G11C 16/20; G11C 11/5642

USPC ........................................................ 365/208
See application file for complete search history.

(56) References Cited

U.S. PATENT DOCUMENTS

| | | | |
|---|---|---|---|
| 8,281,192 B2 | 10/2012 | Kanno | |
| 8,380,915 B2 | 2/2013 | Wood et al. | |
| 8,811,087 B2 * | 8/2014 | Yun | G11C 11/5642 365/185.02 |
| 8,929,140 B2 * | 1/2015 | Nagashima | G06F 11/1048 365/185.11 |
| 9,013,920 B2 * | 4/2015 | Stoev | G11C 16/3454 365/185.09 |
| 2011/0255345 A1 | 10/2011 | Dong et al. | |
| 2012/0213004 A1 * | 8/2012 | Yun | G11C 11/5642 365/185.11 |
| 2012/0268994 A1 * | 10/2012 | Nagashima | G06F 11/1048 365/185.11 |

(Continued)

FOREIGN PATENT DOCUMENTS

JP    2011-065687    3/2011

Primary Examiner — Pho M Luu
Assistant Examiner — Xiaochun L Chen
(74) Attorney, Agent, or Firm — Patterson & Sheridan, LLP (57) ABSTRACT

A semiconductor memory device includes a semiconductor memory chip including a plurality of regions of memory cells, including a first memory region and a second memory region, and a memory controller configured to carry out a read of a memory cell in the first memory region by applying a first read voltage, and a read of a memory cell in the second memory region by applying a second read voltage that is different from the first read voltage.

19 Claims, 7 Drawing Sheets

(56) References Cited

U.S. PATENT DOCUMENTS

| | | | |
|---|---|---|---|
| 2014/0140148 A1* | 5/2014 | An | G11C 11/5642 365/189.14 |
| 2014/0244892 A1 | 8/2014 | Goss et al. | |
| 2014/0269055 A1* | 9/2014 | Kurosawa | G11C 16/10 365/185.03 |
| 2014/0301142 A1* | 10/2014 | Stoev | G11C 16/3454 365/185.09 |
| 2015/0138888 A1* | 5/2015 | Nagashima | G06F 11/1048 365/185.11 |

* cited by examiner

(a) Parameter

| Program/Erase cycle → | 0 | 1 | 2 | ... | n-1 |
|---|---|---|---|---|---|
| Read voltage | $R_a(1)$ | $R_b(1)$ | $R_c(1)$ | ... | $R_n(1)$ |
| Programming voltage | $P_a(1)$ | $P_b(1)$ | $P_c(1)$ | ... | $P_n(1)$ |
| Erase voltage | $E_a(1)$ | $E_b(1)$ | $E_c(1)$ | ... | $E_n(1)$ |
| ... | ... | ... | ... | ... | ... |

(b) Read voltage

| Program/Erase cycle → | 0 | 1 | 2 | ... | n-1 |
|---|---|---|---|---|---|
| Memory Region A | $\alpha_a(1)$ | $\alpha_b(1)$ | $\alpha_c(1)$ | ... | $\alpha_n(1)$ |
| Memory Region B | $\beta_a(1)$ | $\beta_b(1)$ | $\beta_c(1)$ | ... | $\beta_n(1)$ |
| Memory Region C | $\gamma_a(1)$ | $\gamma_b(1)$ | $\gamma_c(1)$ | ... | $\gamma_n(1)$ |
| ... | ... | ... | ... | ... | ... |

⇩

(c) Parameter

| Program/Erase cycle → | 0 | 1 | 2 | ... | n-1 |
|---|---|---|---|---|---|
| Read voltage | $R_a(1)+\alpha_a(1)$ $R_b(1)+\beta_a(1)$ $R_c(1)+\gamma_a(1)$ ... | $R_a(1)+\alpha_b(1)$ $R_b(1)+\beta_b(1)$ $R_c(1)+\gamma_b(1)$ ... | $R_a(1)+\alpha_c(1)$ $R_b(1)+\beta_c(1)$ $R_c(1)+\gamma_c(1)$ ... | ... | $R_a(1)+\alpha_n(1)$ $R_b(1)+\beta_n(1)$ $R_c(1)+\gamma_n(1)$ ... |
| ... | ... | ... | ... | ... | ... |

(a) Parameter

| Non-processing cycle → | 0 | 1 | 2 | ... | n-1 |
|---|---|---|---|---|---|
| Read voltage | $R_a(2)$ | $R_b(2)$ | $R_c(2)$ | ... | $R_n(2)$ |
| Programming voltage | $P_a(2)$ | $P_b(2)$ | $P_c(2)$ | ... | $P_n(2)$ |
| Erase voltage | $E_a(2)$ | $E_b(2)$ | $E_c(2)$ | ... | $E_n(2)$ |
| ... | ... | ... | ... | ... | ... |

(b) Read voltage

| Non-processing cycle → | 0 | 1 | 2 | ... | n-1 |
|---|---|---|---|---|---|
| Memory Region A | $\alpha_a(2)$ | $\alpha_b(2)$ | $\alpha_c(2)$ | ... | $\alpha_n(2)$ |
| Memory Region B | $\beta_a(2)$ | $\beta_b(2)$ | $\beta_c(2)$ | ... | $\beta_n(2)$ |
| Memory Region C | $\gamma_a(2)$ | $\gamma_b(2)$ | $\gamma_c(2)$ | ... | $\gamma_n(2)$ |
| ... | ... | ... | ... | ... | ... |

(c) Parameter

| Non-processing cycle → | 0 | 1 | 2 | ... | n-1 |
|---|---|---|---|---|---|
| Read voltage | $R_a(2)+\alpha_a(2)$ <br> $R_b(2)+\beta_a(2)$ <br> $R_c(2)+\gamma_a(2)$ <br> ... | $R_a(2)+\alpha_b(2)$ <br> $R_b(2)+\beta_b(2)$ <br> $R_c(2)+\gamma_b(2)$ <br> ... | $R_a(2)+\alpha_c(2)$ <br> $R_b(2)+\beta_c(2)$ <br> $R_c(2)+\gamma_c(2)$ <br> ... | ... | $R_a(2)+\alpha_n(2)$ <br> $R_b(2)+\beta_n(2)$ <br> $R_c(2)+\gamma_n(2)$ <br> ... |
| ... | ... | ... | ... | ... | ... |

SEMICONDUCTOR MEMORY DEVICE THAT VARIES VOLTAGE LEVELS DEPENDING ON WHICH OF DIFFERENT MEMORY REGIONS THEREOF IS ACCESSED

CROSS-REFERENCE TO RELATED APPLICATION

This application is based upon and claims the benefit of priority from Provisional Application No. 62/244,355, filed Oct. 21, 2015, the entire contents of which are incorporated herein by reference.

FIELD

Embodiments described herein relate generally to a semiconductor memory device, in particular, a semiconductor memory device that varies voltage levels depending on which of different memory regions thereof is accessed.

BACKGROUND

A semiconductor memory device of one type includes as an SSD (solid state drive), which uses flash memory. Such a semiconductor memory device may determine and set operation parameters such as a read voltage, to increase the reliability of the semiconductor memory device.

DETAILED DESCRIPTION

A semiconductor memory device according to embodiments includes a semiconductor memory chip including a plurality of regions of memory cells, including a first memory region and a second memory region, and a memory controller configured to carry out a read of a memory cell in the first memory region by applying a first read voltage, and a read of a memory cell in the second memory region by applying a second read voltage that is different from the first read voltage.

Below, a semiconductor memory device, a memory controller, and a memory control method according to embodiments are described with reference to the drawings.

Figure 1:
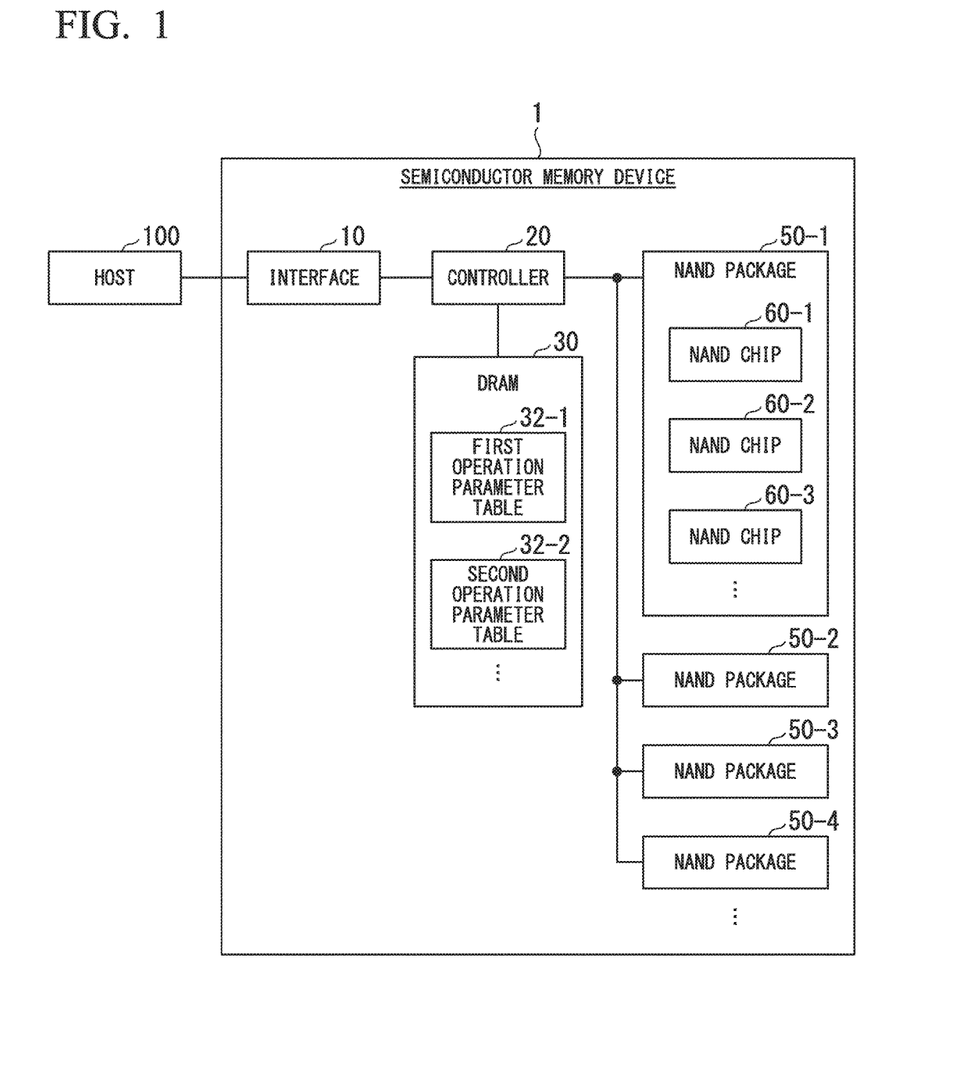
FIG. 1 is a block diagram of a semiconductor memory device according to an embodiment.

FIG. 1 is a block diagram of a semiconductor memory device 1 according to an embodiment. The semiconductor memory device 1 may include an interface 10, a controller 20, a DRAM (dynamic random access memory) 30, and NAND packages 50-1, 50-2, 50-3, 50-4 . . . . There is no limitation to the number of the NAND packages, and the semiconductor memory device 1 may include any number of NAND packages. In the description below, when no distinction is made among the NAND packages, the NAND package is described with 50. The NAND package 50 may include a plurality of NAND chips (memory chips) 60-1, 60-2, 60-3 . . . . In the description below, when no distinction is made among the NAND chips, the NAND chip is referred to as NAND chip 60.

The interface 10 has a connector for connecting to a host 100. The interface 10 is an interface such as an ATA (advanced technology attachment) interface, an SCSI (small computer system interface) interface, and etc.

The host 100 is an information processing device such as a personal computer, a server device, and etc. Moreover, the host 100 may be an image recording device or the like that has an information processing device therein. The image recording device includes a mobile terminal having an imaging device such as a still camera, a video camera, etc., or a desktop server, etc.

When carrying out reading or writing of data, the host 100 sends LBA (logical block addressing) as a logical address via the interface 10, together with a write request or a read request, to the semiconductor memory device 1.

The LBA is a logical address having a serial number that starts at zero and is assigned for each set of predetermined bytes. The host 100 may use arbitrary key information instead of the LBA. In this case, the semiconductor memory device 1 uses an address conversion table to convert the key information to a physical address instead of an address conversion table to convert the LBA to the physical address.

The controller 20 may be configured as an SoC (system on chip), but is not limited thereto. The controller 20 may include a processor such as a CPU (central processing unit), etc., an LSI (large scale integration), an ASIC (application specific integrated circuit), an FPGA (field-programmable gate array), or a combination thereof.

Based on instructions from the host 100 that are received by the interface 10, the controller 20 controls reading of data from NAND memory within the NAND chip 60 or writing of data into the NAND memory. The controller 20 uses an address conversion table, which is developed on the DRAM 30 from the NAND chip 60 or a ROM (not shown), to convert a logical address included in the instructions (a command) acquired via the interface 10 to a physical address. The controller 20 has a NAND interface (not shown), uses the converted physical address to access a desired NAND memory and read/write data therefrom/thereto.

In addition to as a storage region of the above-described address conversion table developed thereinto, the DRAM 30 is used as a write buffer, read buffer, rewrite buffer, a cache memory, etc., by the controller 20. Moreover, tables including a first operation parameter table 32-1 and a second operation parameter table 32-2 are stored in the DRAM 30.

The semiconductor memory device 1 may employ an SRAM (static RAM) instead of or in addition to the DRAM.

Moreover, the controller 20 performs various processes such as wear leveling, garbage collection, refresh, bad block management, error correction process (ECC process), and etc. The wear leveling is a process to uniformize the number of rewrite times among memory devices. The garbage collection is a process such that an active block storing lesser valid data is selected and the valid data in the selected active block is moved to a free block, and the active block is used as a free block after data erasing therein. The valid data represent data associated with the logical address. The refresh is a process to rewrite all data stored in a certain block into a different block based on conditions of an error occurrence, etc., for example. Below, a block is meant to be a physical block.

Figure 2:
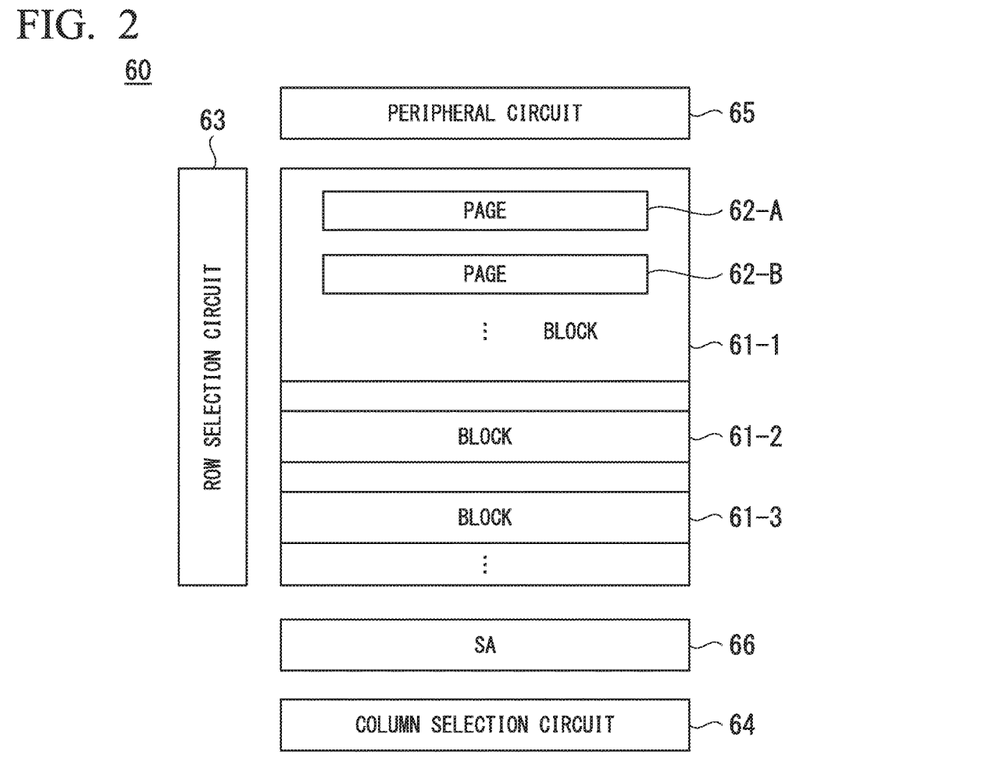
FIG. 2 is a block diagram of a NAND chip in the semiconductor memory device according to the embodiment.

FIG. 2 is a block diagram of the NAND chip 60 according to the present embodiment. The NAND chip 60 includes a memory cell array in which memory cells are arranged in an array. The NAND chip 60 includes a plurality of physical blocks 61-1, 61-2, 61-3 . . . , a row selection circuit 63, a column selection circuit 64, a peripheral circuit 65, and a sense amplifier (SA) 66. The physical block will be hereinafter referred to as a block 61. Below, the block is referred to as block 61 when no distinction is made among the plurality of blocks.

Each of the blocks 61 includes memory cells. Data erasure is performed in unit of the block 61. Each of the blocks 61 includes a plurality of pages 62-A, 62-B . . . . Below, the page is referred to as page 62 when no distinction is made among the plurality of pages. Each of the pages 62 includes memory cells. Data writing is performed in unit of the page 62.

The row selection circuit 63 selects memory cells along a row at the time of read/write and erase operations of the memory cells. The column selection circuit 64 selects, one by one, memory cells along a column at the time of read/write and erase operations of the memory cells. The peripheral circuit 65 sets various voltages to be applied to the memory cells. The SA 66 determines data read from the memory cell of each column. A voltage is applied from both the row and column directions in the memory cells of a single block 61.

Figure 3:
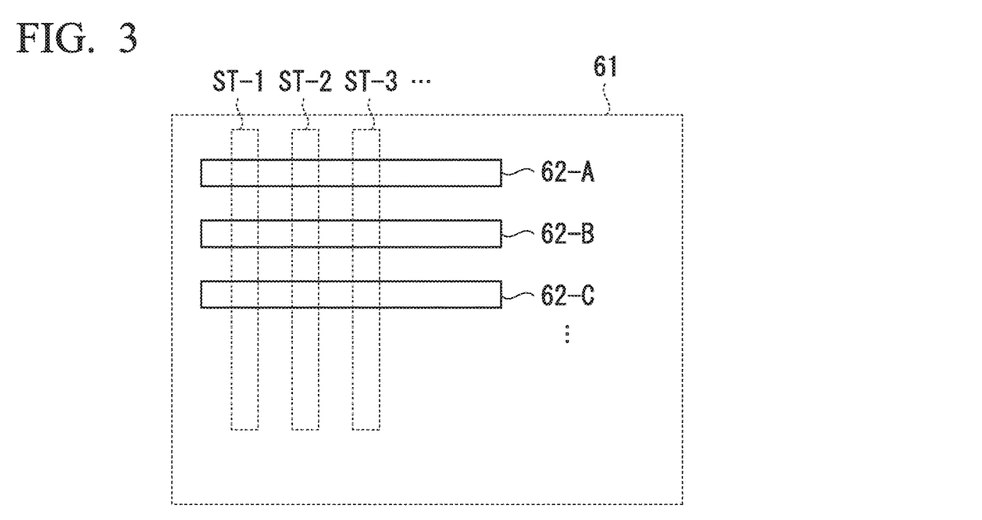
FIG. 3 schematically illustrates rows and columns of one block of the NAND chip.

FIG. 3 illustrates rows and columns of the block, to describe voltage application in the NAND chip 60 according to the present embodiment. In the NAND chip 60, memory cells within a block 61 are grouped into pages 62-A, 62-B, 62-C . . . , each of which is arranged in a row direction and corresponds to a word line. Similarly, the memory cells in the block 61 are grouped into strings ST-1, ST-2, ST-3 . . . , each of which is arranged in a column direction and corresponds to a bit line.

When data are written into a memory cell, a high voltage V1 (known as a write voltage or a programming voltage) is applied to a word line connected to the memory cell (target cell), and a voltage V2, which is lower than the voltage V1, is applied to the other word lines. Moreover, a voltage is also applied to a bit line connected to the target cell to cause a floating layer of the target cell to take in electrons.

When data are read from a memory cell, a voltage V3 is applied to word lines other than a word line corresponding to the memory cell to be read from (target cell), a word line connected to the target cell is set to 0 V, and a read voltage Vr is applied to a bit line connected to the target cell. The SA 66 may detect a current in this state to determine data written into the target cell. When the memory cell of the NAND chip 60 is a multi-level cell (MLC)-type memory cell, a plurality of read voltages Vr is set.

When data are erased from a block, in one embodiment, e.g., in the case of 2D NAND, the erase voltage is applied to a termination point between a substrate of the NAND chip 60 and the word line, such that electrons are drained from each of the memory cells of the block that is being erased. In another embodiment, e.g., in the case of 3D NAND, where the memory cells of each string ST are formed along a semiconductor pillar that forms a channel region for the memory cells, the erase voltage is applied to each of the semiconductor pillars of the plurality of strings of memory cells that make up the block that is being erased.

In the NAND chip 60, which is configured as a memory cell array, depending on a physical proximity to a power source or a signal detection circuit, the degree of degradation of the memory cells may vary among the blocks and the pages. Further, depending on the degree of degradation, optimum read voltage Vr may be different. Moreover, because of the nature of the NAND, the optimum read voltage Vr may vary depending on a length of time during which the blocks and the pages are not accessed.

Figure 4:
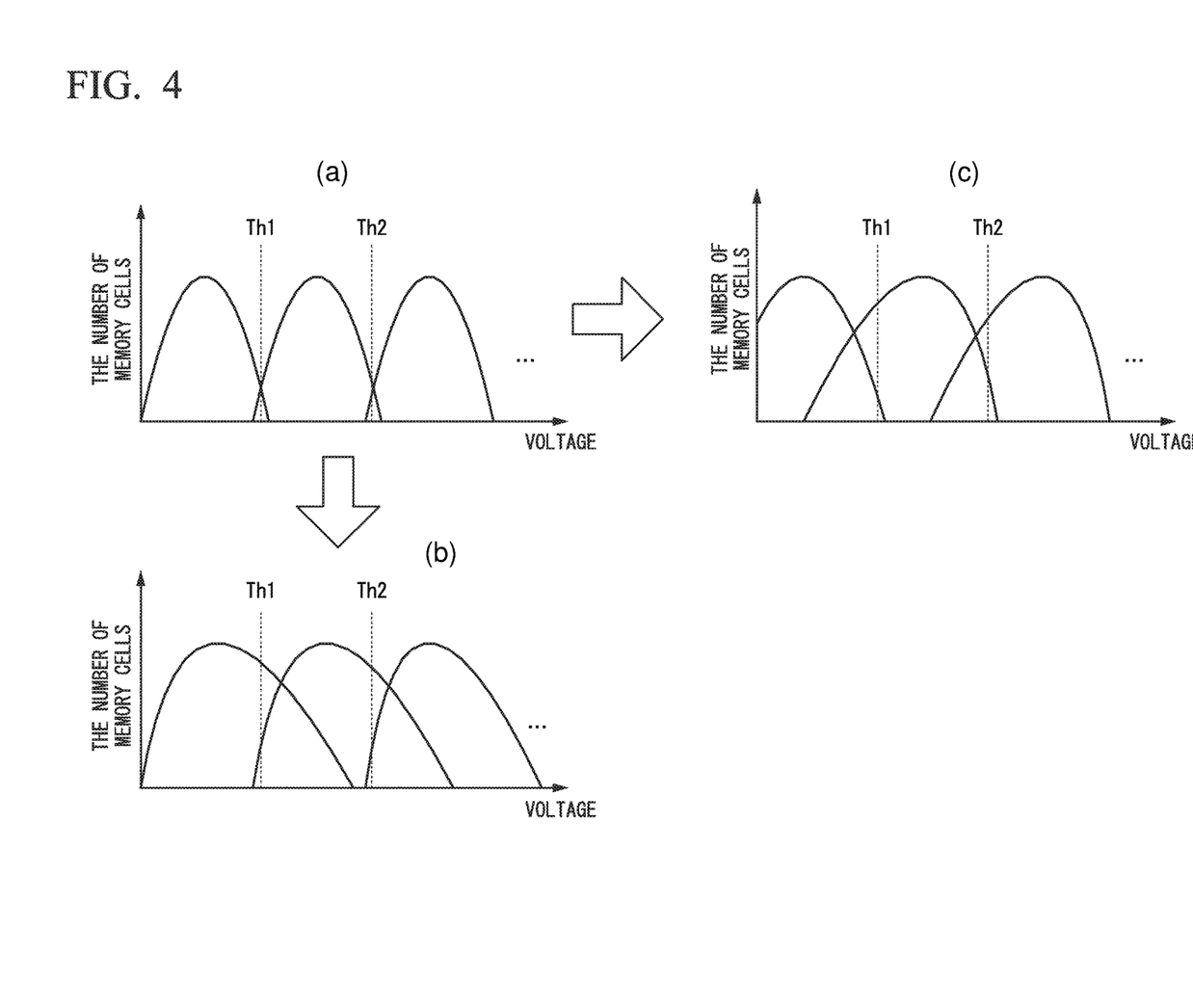
FIG. 4 illustrates distribution of optimum read voltages depending on a condition of the NAND chip.

FIG. 4 illustrates variations of the optimum read voltage Vr. In FIG. 4, the vertical axis indicates the number of memory cells in which current flows when a voltage corresponding to the horizontal axis is applied to the memory cells. The reason why there is a plurality of distribution crests is because the memory cells are of MLC-type (multi-level cell).

Section (a) of FIG. 4 shows a voltage distribution when the NAND memory is in a fresh state immediately after shipment. In this state, the read voltage Vr is set to be around where the two adjacent distributions intersect (thresholds Th1 and Th2 in section (a) of FIG. 4). This setting of the read voltages Vr can suppress error bits or read errors.

Section (b) of FIG. 4 shows a voltage distribution when the NAND memory is degraded due to a plurality of reads/writes performed on the memory cells. The voltage distribution may shift toward the high voltage side in this state. As a result, when the read voltages Vr are set to the thresholds Th1 and Th2, the error bits and the read errors tend to increase. Also, amounts of the shift are not uniform among the memory cells of the NAND chip 60 and may differ depending on the position of the memory cell.

Section (c) of FIG. 4 shows a voltage distribution when the memory cells are left without being accessed (written, read, or erased). In this state, the voltage distribution may shift toward the low voltage side. As a result, when the read voltages Vr are set to the thresholds Th1 and Th2, the error bits and the read errors tend to increase. Also, amounts of the shift are not uniform among the memory cells of the NAND chip 60, and may differ depending on the position of the memory cell.

As to this issue of the voltage shift, the controller 20 according to the present embodiment is configured to adjust operation parameters such as the read voltages Vr, etc., with respect to each portion (e.g., block, page, or cluster) of the NAND chip 60

Figure 5:
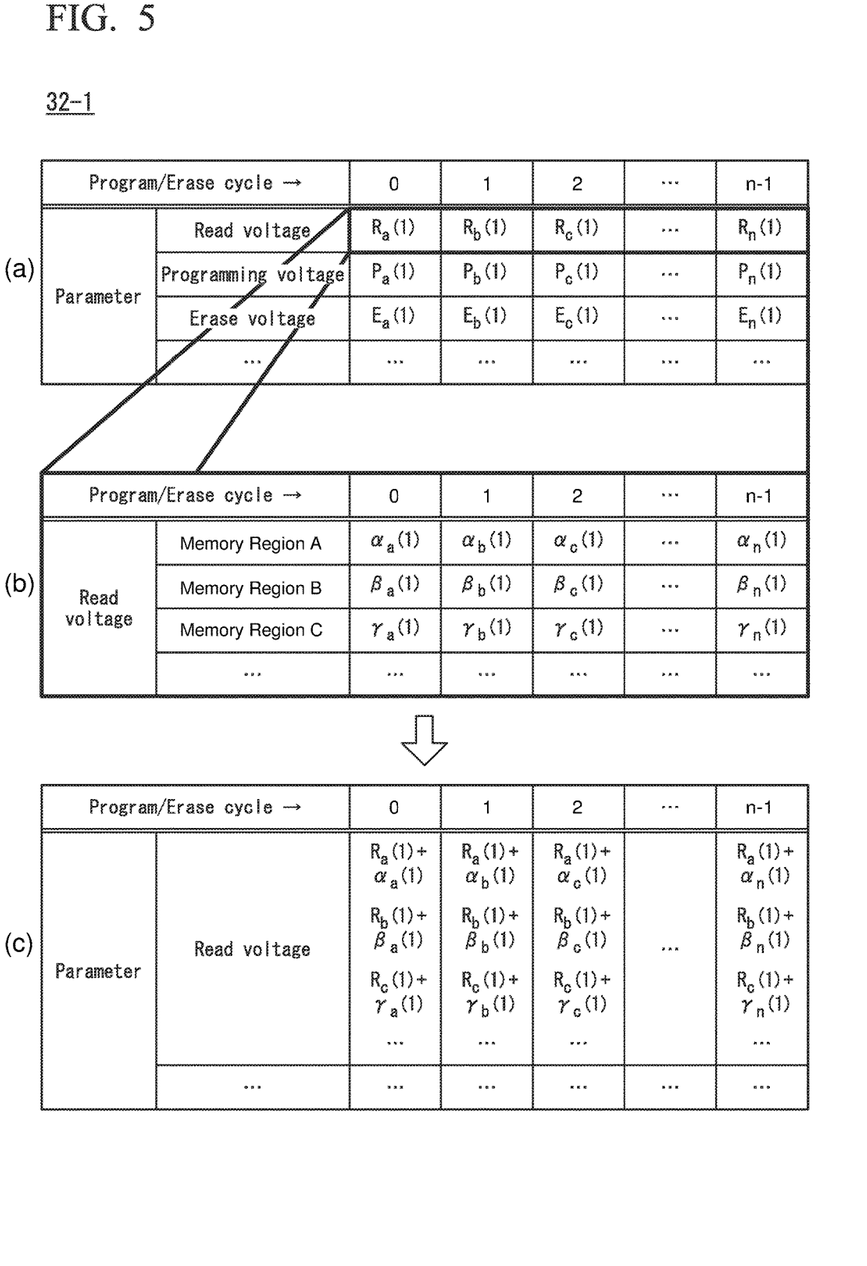
FIG. 5 illustrates a first operation parameter table used by a controller of the semiconductor memory device according to the embodiment.

FIG. 5 illustrates an example of a first operation parameter table 32-1, which is used by the controller 20 according to the present embodiment. The first operation parameter table 32-1 is developed from the NAND chip 60 to the DRAM 30 for use. As shown in section (a) of FIG. 5, a standard value corresponding to a write and/or erase cycle ("Program/Erase cycle" in FIG. 5) is set for each of a read voltage, a write voltage, and an erase voltage, as examples of the operation parameters ("Parameter" in FIG. 5). The write and/or erase cycle is a value obtained, for example, by dividing the number of write and/or erase (access) times by a predetermined number of times (e.g., 1000 times) and ignoring the remainder value. Therefore, for the number of access times between 0 and 999, the write and/or erase cycle is defined as "0", and the standard value of the read voltage(s) Vr is(are) "$R_a(1)$". When the number of access times is 1000 times or more, the write and/or erase cycle is defined as "1", and the standard value of the read voltage(s) Vr is(are) "$R_b(1)$".

Moreover, the first operation parameter table 32-1 specifies correction values of the operation parameters for each portion (e.g., block, page, or cluster) of the NAND chip 60. The standard value and the correction value are associated with each other. The standard value may be common among the portions of the memory chip, and the correction value may be different among the portions.

The "portion" of the NAND chip 60 may be a block 61, a page, a cluster, or other unit. As shown in section (b) of FIG. 5, in the first operation parameter table 32-1, for the read voltage, for example, the correction values are set for a memory region A, a memory region B, and a memory region C, respectively. In some cases, the memory region A, B, or C may correspond to one block 61. In other cases, the memory region A, B, or C may correspond to a plurality of blocks 61 (provided that the memory regions A, B, and C are included one NAND chip 60). Further, in other cases, the memory region A, B, or C may be a plurality of pages of one block 61. In other cases, the memory region A, B, or C may be a plurality of clusters included in one block 61. In the same manner as the standard values, the correction values of the operation parameters are set, in association with the write and/or erase cycle. For example, when the write and/or erase cycle is "0", the correction value on the read voltage of the memory region A is "$\alpha_a(1)$".

Then, the controller 20 may determine the operation parameters for each of the memory regions by calculating the sum of the standard value and the correction value. Alternatively, the controller 20 may use an operation parameter table corresponding to the sum of the standard value and the correction value calculated in advance. Section (c) of FIG. 5 is a diagram which expresses the first operation parameter table by the sum of the standard value and the correction value. For example, when the write/erase cycle is "0", the read voltage of the memory region A is "$R_a(1)+\alpha_a(1)$". Here, while the correction value is set to "a correction amount" and the controller 20 sets the operation parameter by calculating the sum of the standard value and the correction value, the correction value may be "a correction ratio". In this case, the controller 20 may set the operation parameter, for example, by multiplying the standard value and the correction value (or the correction value plus 1).

Moreover, while the standard and correction values are set in units of block 61 for the operation parameters, the same parameter correction may be set in unit smaller than the block 61, such as one or a plurality of pages, or one or a plurality of clusters.

Furthermore, the standard and correction values may be set at the time of manufacturing the semiconductor memory device 1, or dynamically set (changed) during the operation of the device. In the latter case, the controller 20 of the semiconductor memory device 1 or an external device connected to the semiconductor memory device 1 measures error bits for a block 61 or a target unit smaller than the block 61 each time a predetermined number of writes/erases are carried out and changes the correction value in accordance with the number of the error bits.

Figure 6:
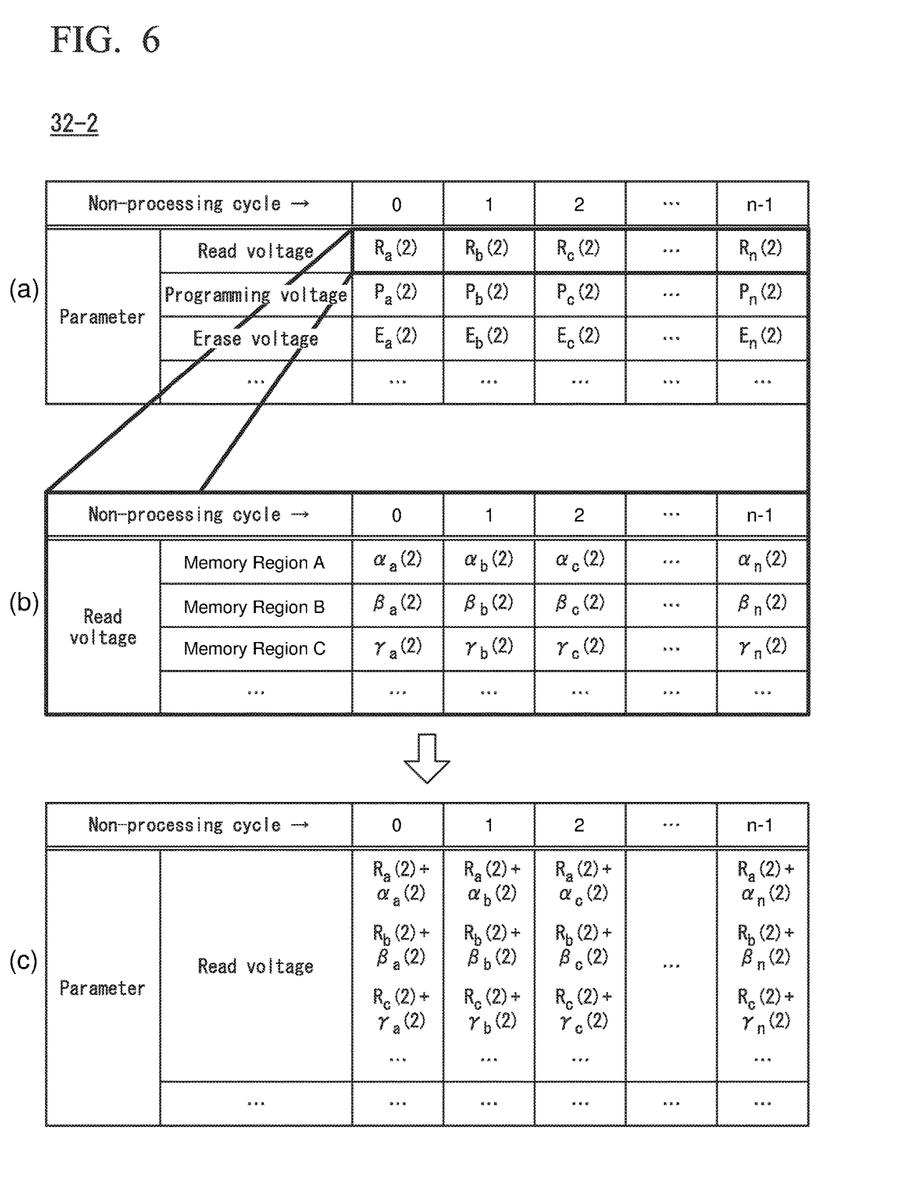
FIG. 6 illustrates a second operation parameter table used by the controller.

FIG. 6 illustrates an example of the second operation parameter table 32-2, which is used by the controller 20 according to the present embodiment. While the first operation parameter table 32-1 shown in FIG. 5 is for adjusting the operation parameters in accordance with the write and/or erase cycle, the first operation parameter table 32-2 shown in FIG. 6 is for adjusting the operation parameters in accordance with elapsed time ("Non-processing cycle"). The elapsed time corresponds to a period of time during which none of write (including rewrite by garbage collection, etc.), read, and erase of data are executed. The non-processing cycle in FIG. 6 is a value obtained by dividing the elapsed time a reference time and ignoring the remainder value.

As shown in section (a) of FIG. 6, a standard value corresponding to the elapsed time is set for each of read, write, and erase voltages, which are examples of the operation parameter. When the elapsed time is "0", the standard value of the read voltage(s) Vr is(are) "$R_a(2)$". When the elapsed time is "1", the standard value of the read voltage(s) Vr is(are) "$R_b(2)$".

Moreover, the second operation table 32-2 specifies the correction value of the operation parameter for each memory region of the NAND chip 60 such as a block 61, page, cluster, and etc. This mechanism is the same as the first operation parameter table 32-1, so that explanations thereof are omitted.

Here, there is no limit to the number of the operation parameters set in the above-described first operator table 32-1 and second operator table 32-2, so that the other operation parameter which may contribute to extend the lifetime of the NAND memory cells can be set appropriately.

Based on a frequency of operations of the NAND memory cell performed by the controller 20, the controller 20 may determine the operation parameters either based on the number of access (erase) times with respect to the semiconductor memory or based on the period of time during which none of operations of the semiconductor memory are performed by the controller 20.

For example, the controller 20 may determine the operation parameters based on the number of access (erase) times when the frequency is higher than a threshold. Also, the controller 20 may determine the operation parameter based on the non-accessed period of time when the frequency is lower than the threshold.

Figure 7:
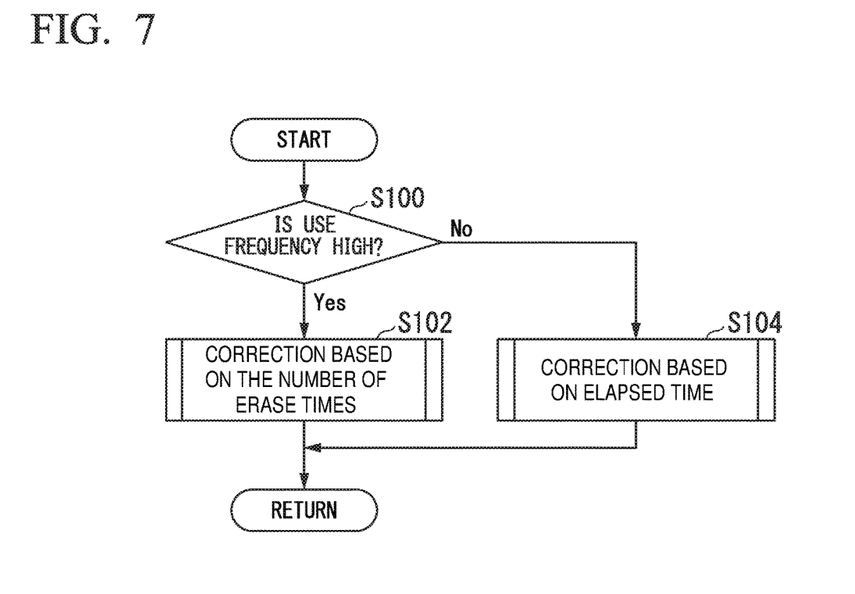
FIG. 7 is a flowchart illustrating a process of selecting an operation parameter table, which is executed by the controller according to the embodiment.

For example, the controller 20 determines one of the first operation parameter table 32-1 and the second operation parameter table 32-2 to be used. FIG. 7 is a flowchart illustrating a process of selecting an operation parameter table referred to by the controller 20 according to the present embodiment.

First, the controller 20 determines whether or not the use frequency of the semiconductor memory device 1 is high (step S100). If the number of write and read times according to instructions from the host 100 during a monitoring period exceed a threshold, the controller 20 determines that the use frequency of the semiconductor memory device 1 is high. To the contrary, if the write and read times do not exceed the threshold, the controller 20 determines that the use frequency of the semiconductor memory device 1 is not high (i.e., low).

If the use frequency of the semiconductor storage device 1 is determined to be high (Yes in step S101), the controller 20 performs correction of the operation parameters based on the number of erase times (step S102). In other words, the controller 20 refers to the first operation parameter table 32-1 to determine the operation parameters. The write and erase are normally in a one-to-one relationship, so that the number of erase times and the number of write times can be alternatively used. The specific procedure of step S102 is described with reference to FIG. 9 below.

On the other hand, when the use frequency of the semiconductor storage device 1 is determined to be low (No in step S101), the controller 20 performs the correction of the operation parameters based on the elapsed time (step S104). In other words, the controller 20 determines the operation parameters using the second operation parameter table 32-2. The specific procedure of step S104 is described with reference to FIG. 10.

Figure 8:
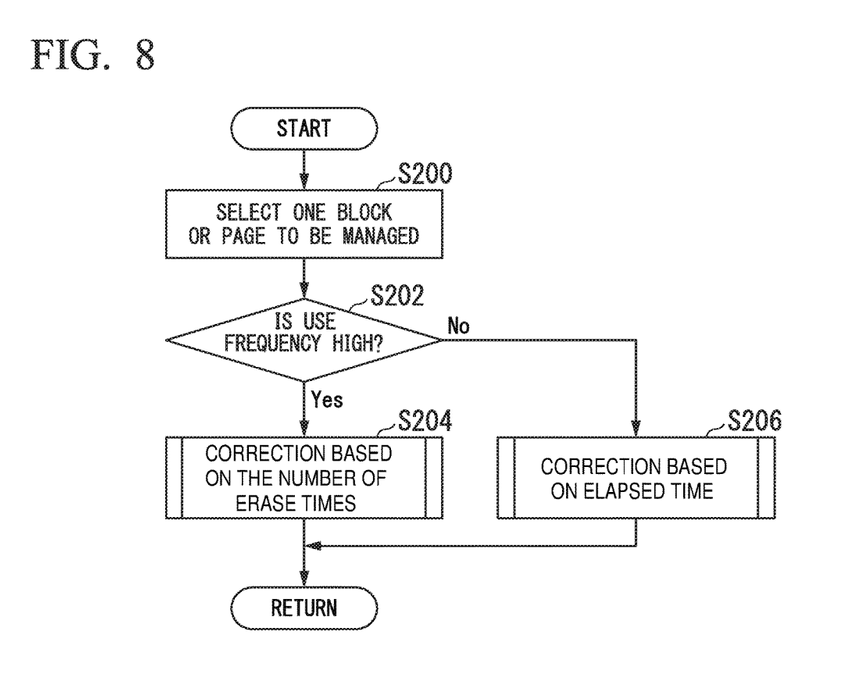
FIG. 8 is a flowchart illustrating another process of selecting the operation parameter table, which is executed by the controller according to the embodiment.

Moreover, the controller 20 may determine whether to use the first operation parameter table 32-1 or the second operation parameter table 32-2 for each block 61 or each page. FIG. 8 is a flowchart illustrating another example of the process of selecting the operation parameter table referred to by the controller 20 according to the present embodiment. The process of the present flowchart is executed for each block 61 or page to be managed.

First, the controller 20 selects one block 61 or one page to be managed (step S200). Then, the controller 20 determines whether or not the use frequency of the selected block or page is high (step S202). "The use frequency" is determined by comparing the threshold and the number of write and read times according to instructions from the host 100, for example, in the same manner as the flowchart shown in FIG. 7.

If the use frequency of the selected block or page is determined to be high (Yes in step S202), the controller 20 performs correction of the operation parameters based on the number of erase times (step S204). That is, the controller 20 determines the operation parameters using the first operation parameter table 32-1 for the selected block or page. The specific procedure of step S204 is described with reference to FIG. 9 below.

On the other hand, when the use frequency of the semiconductor storage device 1 is determined to be low (No in step S202), the controller 20 performs correction of the operation parameters based on the non-accessed elapsed time (step S206). That is, the controller 20 determines the operation parameters using the second operation parameter table 32-2. The specific procedure of step S206 is described with reference to FIG. 10 below.

Figure 9:
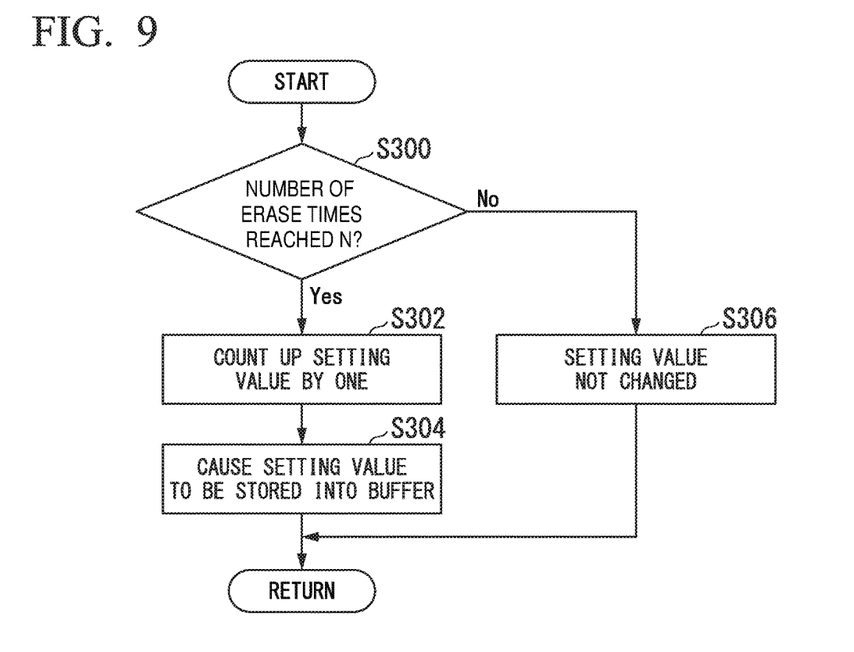
FIG. 9 is a flowchart illustrating a parameter correction process based on the number of erase times, which is executed by the controller according to the embodiment.

FIG. 9 is a flowchart illustrating an example of a parameter correction process based on the number of erase times. The flowchart shown in FIG. 9 corresponds to step S102 in FIG. 7 and step S204 in FIG. 8.

First, the controller 20 determines whether or not the number of erase times has reached N for a target memory region to be managed (e.g., the whole semiconductor memory device 1, a block 61, or a page) (step S300). Here, N corresponds to the predetermined number of times. When the number of erase times has reached N (Yes in step S300), the controller 20 counts up by one a setting value (i.e., the write and/or erase cycle) (step S302). Then, the controller 20 causes the setting value and the operation parameters to be stored into a predetermined buffer of the DRAM 30 (step S304). At this time, the controller 20 clears the number of erase times. On the other hand, if the number of erase times has not reached N (No in step S300), the controller 20 does not change the setting value (step S306).

Figure 10:
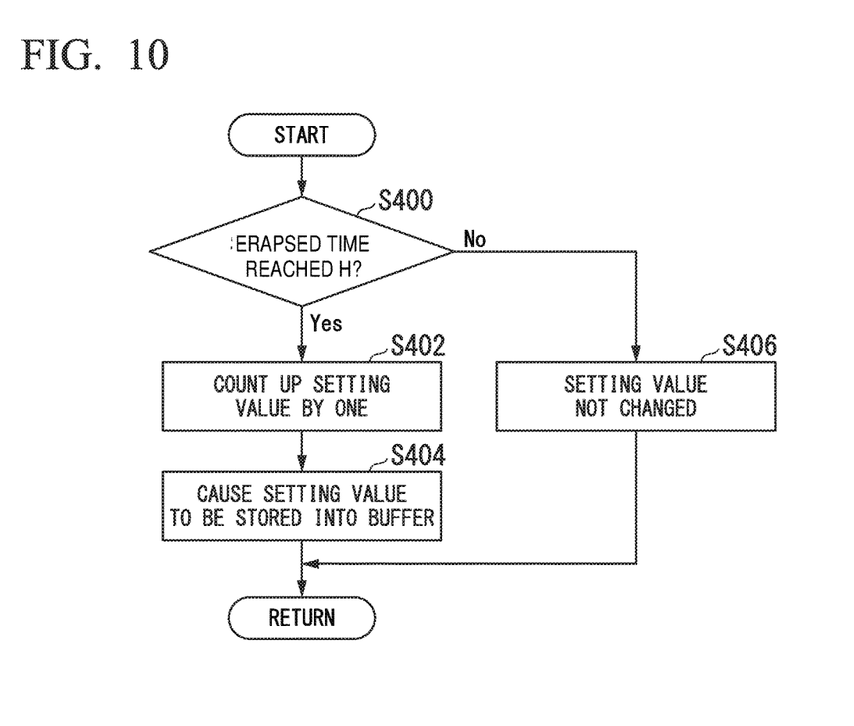
FIG. 10 is a flowchart illustrating a parameter correction process based on an elapsed time, which is executed by the controller according to the embodiment.

FIG. 10 is a flowchart illustrating an example of a parameter correction process based on the non-accessed elapsed time. The flowchart shown in FIG. 10 corresponds to step S104 in FIG. 7 and step S206 in FIG. 8.

First, the controller 20 determines, for a target memory region to be managed (e.g., the whole semiconductor storage device 1, a block 61, or a page), whether or not the elapsed time has reached H (step S400). H is a period of time elapsed from the time when one of write (including rewrite such as garbage collection), read, and erase of data was executed immediately before. If the elapsed time has reached H (Yes in step S400), the controller 20 counts up the setting value of the elapsed time by one (step S402). Then, the controller 20 causes the counted-up setting value and the operation parameters to be stored into a predetermined buffer of the DRAM 30 (step S404). At this time, the controller 20 clears the elapsed time. On the other hand, if the elapsed time has not reached H (No in step S400), the controller 20 does not change the setting value (step S406).

The controller 20 may use either one of the first operation parameter table 32-1 and the second operation parameter table 32-2, or may also use a different operation parameter table.

According to the present embodiment, the semiconductor memory device 1 can improve reliability of data stored in each memory region of the NAND chip 60.

As described above, in the semiconductor memory device 1 having a NAND memory cell array, various characteristics of the memory cells may vary in units of block 61 or page depending on the use thereof. Moreover, even in the fresh state at the time of shipment, it is difficult to set various characteristics of the memory cells to be sufficiently uniform. For these reasons, it would be preferable to set the operation parameters (both standard value and correction value) in units of small memory regions, such as block 61, page, or cluster.

As a different viewpoint, when the number of read errors increases, the read errors are less likely to occur by increasing the read voltages Vr (uniformly) for all memory cells. However, increasing the read voltages Vr for all memory cells may shorten the lifetime of the device, because the wear out of the memory cell progresses in the whole semiconductor memory device 1.

With respect to this issue, the semiconductor memory device 1 according to the present embodiment may set the operation parameters for each memory region of the NAND chip 60. As a result, unnecessary modification of the operation parameters can be suppressed, and, as a result, excessive shortening of the lifetime of the device can be suppressed, compared to a device that changes the operation parameters (uniformly) for all memory cells.

According to at least the above-described embodiment, a semiconductor memory device includes the NAND chip 60 including a plurality of NAND memory cells; the interface 10 which receives instructions from the host 100; and the controller 20 which controls data reading from or data writing to the NAND memory cells based on the instructions from the host 100. The controller 20 determines, for each memory region of the NAND chip 60, at least an operation parameter that is related to an operation performed by the controller 20, to improve the reliability of the semiconductor memory device.

While certain embodiments have been described, these embodiments have been presented by way of example only, and are not intended to limit the scope of the inventions. Indeed, the novel embodiments described herein may be embodied in a variety of other forms: furthermore various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a semiconductor memory chip including a plurality of regions of memory cells, including a first memory region and a second memory region; and
a memory controller configured to
set a first voltage based on a first number of times the first memory region has been accessed since a predetermined point of time and carry out an operation on memory cells of the first memory region by applying the first voltage, when the first number is more than a threshold number, and
set a second voltage that is different from the first voltage based on a period of time that has passed since a last access to the second memory region and carry out the operation on memory cells of the second memory region by applying the second voltage, when a second number of times the second memory region has been accessed since the predetermined point of time is less than the threshold number.

2. The semiconductor memory device according to claim 1, wherein
the semiconductor memory chip is a NAND memory chip, and
the first and second memory regions each correspond to one or more blocks of the semiconductor memory chip.

3. The semiconductor memory device according to claim 1, wherein
the semiconductor memory chip is a NAND memory chip, and
the first memory region corresponds to one or more pages in a block of the semiconductor memory chip, and the second memory region corresponds to one or more pages in the block of the semiconductor memory chip.

4. The semiconductor memory device according to claim 1, wherein the operation is a read operation.

5. The semiconductor memory device according to claim 1, wherein the operation is a write operation.

6. The semiconductor memory device according to claim 1, wherein the operation is an erase operation.

7. The semiconductor memory device according to claim 1, wherein
the first and second voltages are applied to at least one of bit lines that are connected to the memory cells of the first and second memory regions, respectively.

8. The semiconductor memory device according to claim 1, wherein
the first and second voltages are applied to at least one of word lines that are connected to the memory cells of the first and second memory regions, respectively.

9. A semiconductor memory device, comprising:
a semiconductor memory chip including a plurality of regions of memory cells, including a first memory region and a second memory region; and
a memory controller configured to
set a first voltage based on a first period of time that has passed since a last access to the first memory region and carry out an operation on memory cells of the first memory region by applying the first voltage, when a first number of times the first memory region has been accessed since the predetermined point of time is less than a threshold number, and
set a second voltage that is different from the first voltage based on a second period of time that has passed since a last access to the second memory region and carry out the operation on memory cells of the second memory region by applying the second voltage, when a second number of times the second memory region has been accessed since the predetermined point of time is less than the threshold number.

10. The semiconductor memory device according to claim 9, wherein
the semiconductor memory chip is a NAND memory chip, and
the first and second memory regions each correspond to one or more blocks of the semiconductor memory chip.

11. The semiconductor memory device according to claim 9, wherein
the semiconductor memory chip is a NAND memory chip, and
the first memory region corresponds to one or more pages in a block of the semiconductor memory chip, and the second memory region corresponds to one or more pages in the block of the semiconductor memory chip.

12. The semiconductor memory device according to claim 9, wherein the operation is a read operation.

13. The semiconductor memory device according to claim 9, wherein the operation is a write operation.

14. The semiconductor memory device according to claim 9, wherein the operation is an erase operation.

15. The semiconductor memory device according to claim 9, wherein
the first and second voltages are applied to at least one of bit lines that are connected to the memory cells of the first and second memory regions, respectively.

16. The semiconductor memory device according to claim 9, wherein
the first and second voltages are applied to at least one of word lines that are connected to the memory cells of the first and second memory regions, respectively.

17. A semiconductor memory device, comprising:
a semiconductor memory chip including a plurality of regions of memory cells, including a first memory region and a second memory region; and
a memory controller configured to:
set a first voltage based on a number of error bits included in data read from the first memory region and perform an erase operation on memory cells of the first memory region by applying the first voltage, and
set a second voltage that is different from the first voltage based on a number of error bits included in data read from the second memory region and perform the erase operation on memory cells of the second memory region by applying the second voltage.

18. The semiconductor memory device according to claim 17, wherein
the memory controller sets the first voltage further based on a first number of times the first memory region has been accessed since a predetermined point of time when the first number is more than a threshold number, and sets the second voltage further based on a period of time that has passed since a last access to the second memory region, when a second number of times the second memory region has been accessed since the predetermined point of time is less than the threshold number.

19. The semiconductor memory device according to claim 17, wherein
the memory controller sets the first voltage further based on a first period of time that has passed since a last access to the first memory region, when a first number of times the first memory region has been accessed since the predetermined point of time is less than a threshold number, and sets the second voltage further based on a second period of time that has passed since a last access to the second memory region, when a second number of times the second memory region has been accessed since the predetermined point of time is less than the threshold number.

* * * * *